United States Patent
Braat

(10) Patent No.: US 6,199,991 B1
(45) Date of Patent: Mar. 13, 2001

(54) MIRROR PROJECTION SYSTEM FOR A SCANNING LITHOGRAPHIC PROJECTION APPARATUS, AND LITHOGRAPHIC APPARATUS COMPRISING SUCH A SYSTEM

(75) Inventor: Josephus J. M. Braat, Eindhoven (NL)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/135,862

(22) Filed: Aug. 18, 1998

(30) Foreign Application Priority Data

Nov. 13, 1997 (EP) .................................................. 97203536
Apr. 2, 1998 (EP) .................................................. 98201055

(51) Int. Cl.[7] ................................................. G02B 5/08
(52) U.S. Cl. ..................... 359/856; 359/857; 359/858; 359/859; 359/861; 359/365; 359/366
(58) Field of Search ..................... 359/856, 857, 359/858, 859, 861, 365, 366; 378/34, 35; 372/103

(56) References Cited

U.S. PATENT DOCUMENTS

| | | |
|---|---|---|
| 5,071,240 | * 12/1991 | Ichihara et al. ................... 359/366 |
| 5,144,363 | 9/1992 | Wittekoek et al. ................... 355/53 |
| 5,153,898 | * 10/1992 | Suzuki et al. ................... 378/34 |
| 5,191,200 | 3/1993 | Van Der Werf et al. ........... 250/201.4 |
| 5,805,365 | * 9/1998 | Sweatt ................... 359/858 |
| 5,815,310 | * 9/1998 | Williamson ................... 359/365 |

FOREIGN PATENT DOCUMENTS

| | | |
|---|---|---|
| 0779528A2 | 6/1997 | (EP) . |
| WO9733204 | 9/1997 | (WO) . |

* cited by examiner

Primary Examiner—Mohammad Y. Sikder
(74) Attorney, Agent, or Firm—F. Brice Faller

(57) ABSTRACT

A mask pattern is repetitively scan-imaged on a number of areas of a substrate by means of a beam of EUV radiation having a circular segment-shaped cross-section. This system, which is easier to manufacture at lower cost than a projection system with six or more imaging mirrors, has only five imaging mirrors with a good numerical aperture and an acceptable image-ringfield width. An EUV lithographic projection apparatus provided with the new projection system has a wafer throughput which is approximately 50% higher than that of an apparatus provided with a six-mirror projection system. Moreover, it has a compact construction.

8 Claims, 4 Drawing Sheets

Figure 1:
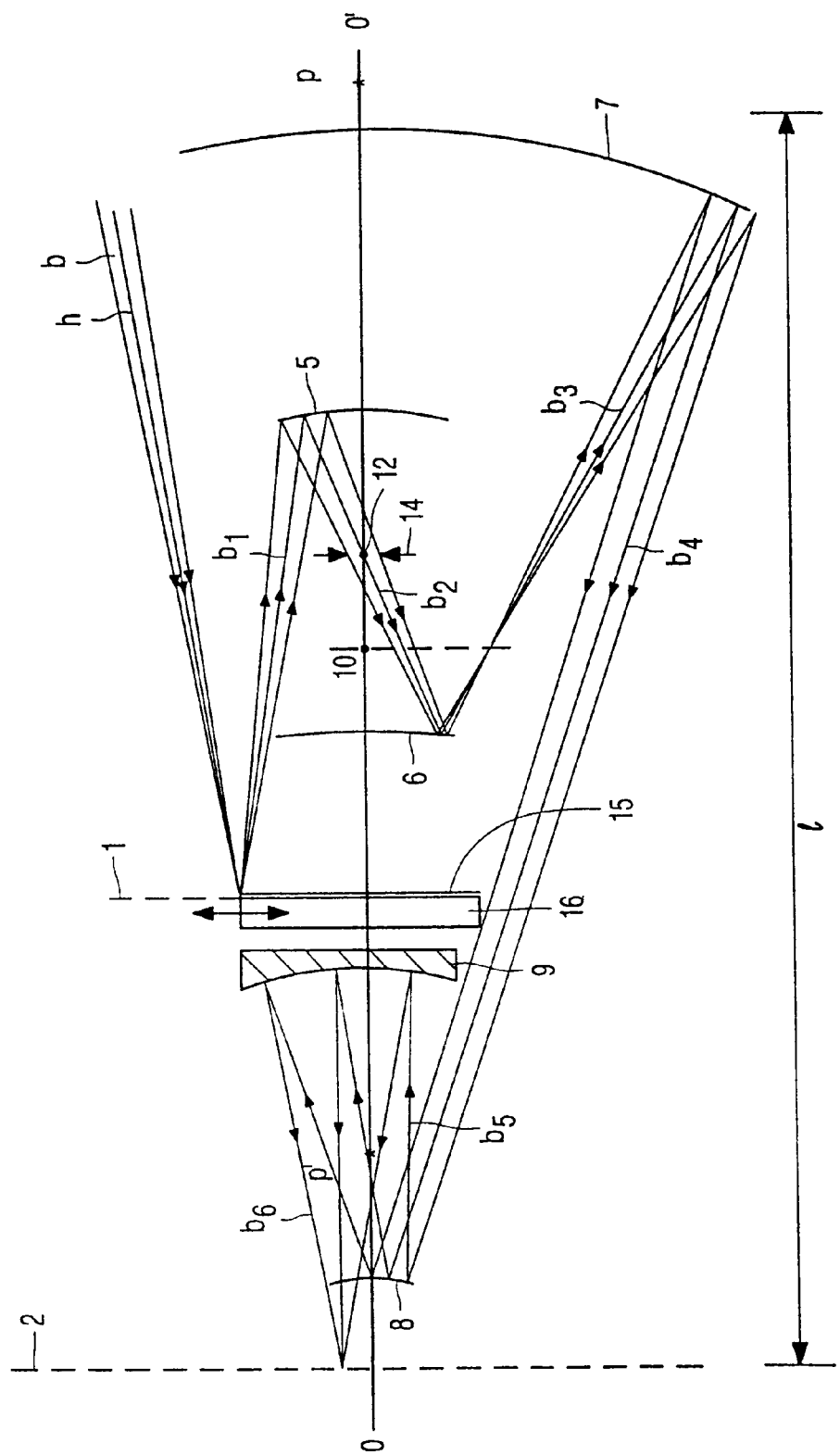

MIRROR PROJECTION SYSTEM FOR A SCANNING LITHOGRAPHIC PROJECTION APPARATUS, AND LITHOGRAPHIC APPARATUS COMPRISING SUCH A SYSTEM

BACKGROUND OF THE INVENTION

The invention relates to a mirror projection system for use in a step-and-scan lithographic projection apparatus for imaging a mask pattern, present in a mask, on a substrate by means of a beam of EUV radiation, which beam has a circular segment-shaped cross-section.

The invention also relates to a lithographic apparatus for step-and-scan imaging of a mask pattern on a number of areas of a substrate, which apparatus comprises such a mirror projection system.

U.S. Pat. No. 5,815,310 describes a mirror projection system for use in a step-and-scan lithographic apparatus with which an IC mask pattern is imaged on a number of areas of a semiconductor substrate, using EUV radiation. EUV, extreme ultraviolet, radiation is understood to mean radiation having a wavelength in the range between several nm and several tens of nm. This radiation is also referred to as soft X-ray radiation. The use of EUV radiation provides the great advantage that extremely small details, of the order of 0.1 $\mu$m or less, can be imaged satisfactorily. In other words, an imaging system in which EUV radiation is used has a very high resolving power without the NA of the system having to be extremely large, so that also the depth of focus of the system still has a reasonably large value. Since no suitable material of which lenses can be made is available for EUV radiation, a mirror projection system must be used for imaging the mask pattern on the substrate, instead of a hitherto conventional lens projection system.

The lithographic apparatuses currently used in the production of ICs are stepping apparatuses. In these apparatuses, a full field illumination is used, i.e. all areas of the mask pattern are illuminated simultaneously and these areas are simultaneously imaged on an IC area of the substrate. After a first IC area has been illuminated, a step is made to a subsequent IC area, i.e. the substrate holder is moved in such a way that the next IC area will be positioned under the mask pattern, whereafter this area is illuminated, and so forth until all IC areas of the substrate of the mask pattern are illuminated. As is known, it remains desirable to have ICs with an increasing number of components.

It is attempted to meet this desire not only by reducing the dimensions of these components but also by enlarging the surface areas of the ICs. This means that the, already relatively high, NA of the projection lens system must be further increased and, for a stepping apparatus, the image field of this system must also be further increased. This is practically impossible.

It has therefore been proposed to change from a stepping apparatus to a step-and-scan apparatus. In such an apparatus, an annular segment-shaped sub-area of the mask pattern and hence also such a sub-area of an IC area of the substrate is illuminated, and the mask pattern and the substrate are moved synchronously through the illumination beam, taking the magnification of the projection system into account. A subsequent annular segment-shaped sub-area of the mask pattern is then imaged each time on a corresponding sub-area of the relevant IC area on the substrate. After the entire mask pattern has been imaged on an IC area in this way, the substrate holder performs a stepping movement, i.e. the beginning of a subsequent IC area is introduced into the projection beam and the mask is set to its initial position, whereafter said subsequent IC area is scan-illuminated via the mask pattern. This scan-imaging method may be used to great advantage in a lithographic apparatus in which EUV radiation is used as projection radiation.

The embodiment of the projection system described in U.S. Pat. No. 5,815,310, intended for use with EUV radiation having a wavelength of 13 nm, has an NA of 0.25 at the image side. The annular image field has an inner radius of 29 mm and an outer radius of 31 mm and a length of 30 mm. The resolution of the system is 30 nm and the aberrations and distortions are sufficiently small to form a good image of a transmission mask pattern on an IC area of a substrate by way of a scanning process. This projection system comprises six imaging mirrors, and an intermediate image is formed between the third and the fourth mirror. The mask is situated at one geometric end of the projection system, and the substrate is situated at the other geometric end of this system.

When such a mirror system is used in a lithographic projection apparatus, the small quantity of radiation incident on the substrate presents a problem. This problem is caused by the fact that the mirrors are considerably less than 100% reflective. Each of these mirrors comprises a multilayer structure whose composition is optimized for the relevant wavelength. Examples of such multilayer structures are described in U.S. Pat. No. 5,153,898. With such multilayer structures, maximum reflections can be achieved which are theoretically of the order of 75% but, in practice are currently not larger than 65%. When six mirrors are used, each with a reflection of 68% in a projection system, only 9.9% of the radiation originating from the mask pattern and entering the system reaches the substrate. For a lithographic apparatus, this means in practice that the illumination time should be relatively long so as to obtain the desired quantity of radiation energy on an IC area of the substrate, and the scanning rate should be relatively small for a scanning apparatus. However, it is essential for these apparatuses that the scanning rate is as high as possible and the illumination time is as low as possible, so that the throughput, i.e. the number of substrates which can be illuminated per unit of time, is as high as possible.

SUMMARY OF THE INVENTION

It is an object of the present invention to provide a projection system with which this requirement can be met. To this end, the projection system has only five imaging mirrors.

An imaging mirror is understood to be a concave (positive) mirror or a convex (negative) mirror which has a converging or a diverging effect and consequently contributes to the imaging by the mirror projection system.

Since only five imaging mirrors are used, the projection system can be manufactured more easily and at lower cost. Indeed, very stringent requirements of accuracy are imposed on an imaging mirror, so that this mirror itself is difficult to manufacture and is expensive. If such a mirror can be omitted from an optical system, this will involve a considerable reduction of cost, also because it will then be easier to assemble this system. A very important advantage of a projection system with five, instead of six, mirrors is that, in principle, the quantity of radiation on the substrate can be raised by approximately 50%. In the given example of 68% reflecting multilayer structures, the quantity of radiation incident on the substrate in a five-mirror system is 14.5% of the radiation entering the projection system. The invention is based on the recognition that, also with five imaging mirrors, a projection system can be realized having a numerical aperture which is by all means acceptable, and has sufficiently small aberrations. With the novel projection system, an annular segment-shaped scanning image spot is formed which is comparable with that formed by the known six-mirror system.

It is to be noted that U.S. Pat. No. 5,153,898 claims a mirror projection system comprising at least three and at most five mirrors. However, three mirrors are used for the actual imaging. In the embodiment using a fourth mirror, this mirror is a flat mirror having the function of giving the imaging beam a different direction so that room is created for the substrate to perform the desired movements. An embodiment with five imaging mirrors is not described. The projection systems described in U.S. Pat. No. 5,153,898 have a small numerical aperture, namely 0.05 or smaller, and all of them are intended for full-field illumination, hence not for use in a scanning apparatus. It is true that U.S. Pat. No. 5,153,898 remarks that the mirror system can be made suitable for a scanning apparatus, but no design is given for a mirror system suitable for this application.

Within the above-mentioned design concept of the novel projection system, there is still some freedom of choice of the parameters NA, magnification and image spot. A preferred embodiment of the system is, however, characterized in that it has a numerical aperture NA of 0.20 and a magnification M of 0.25.

The projection system preferably includes, in a sequence from the object plane to the image plane, a concave first mirror, a convex second mirror, a concave third mirror, a convex fourth mirror and a concave fifth mirror, and the object plane is situated between the second and the fifth mirror.

The projection system is preferably telecentric at the image side.

Consequently, no magnification errors can occur upon undesired displacements of the substrate along the optical axis.

The pupil is situated between the first and the second imaging mirror.

The system is then designed in such a way that there is sufficient space to accommodate a diaphragm at that position between the beams extending in opposite directions.

Preferably, all imaging mirrors have aspherical surfaces.

The system is then satisfactorily corrected and has a good imaging quality.

A mirror projection system according to the invention, which is optimal as regards radiation efficiency and build-in space, is characterized in that the object plane is situated between the second and the fifth imaging mirror and in that space for a reflective mask and its holder is reserved between these mirrors.

When this projection system is used in a lithographic apparatus, the dimension of the apparatus in the direction of the optical axis may remain limited because the mask holder is arranged in the projection system in which it can perform the necessary movements via the mask table accommodating the mask holder. The mirror projection system is now divided into a collimator section, consisting of the first three mirrors which jointly form a substantially parallel imaging beam, and an objective section receiving this beam. The latter section, consisting of the fourth and the fifth mirror, constitutes the desired telecentric imaging beam. An intermediate image is formed proximate to the second, convex mirror, which intermediate image is very effective for correcting curvatures of the image field. Space for accommodating a diaphragm is available between the first and the second imaging mirror.

Under circumstances, for example, when more space for the mask table is needed, it may be desirable that the mask be situated outside the projection system and at the side of this system other than where the substrate is situated, i.e. the object plane and the image plane are situated at different sides of the projection system. The concept of a projection system with five imaging mirrors can also be used in that case. The adapted embodiment of the projection system is characterized in that a plane mirror is arranged between the first and the second imaging mirror, and in that the object plane is situated outside the projection system.

The plane mirror does not contribute to the actual formation of the image, but only reverses the direction of the radiation from the first imaging mirror. Since the plane mirror can be more easily manufactured and positioned than an imaging mirror, the advantage of a projection system with five imaging mirrors, as compared with a projection system having six imaging mirrors, is maintained.

To achieve the desired optical quality, the annular segment-shaped image field of the projection system with a plane mirror has a slightly smaller width than that in a projection system with five mirrors. An embodiment of the projection system with a plane mirror having an enlarged image field is characterized in that the plane mirror has an aspherical correction surface.

Due to this aspherical surface, the projection system as a whole can be better corrected and, in principle, the annular segment-shaped image field may have an equally large width as the width in the projection system having five imaging mirrors.

The invention also relates to a lithographic apparatus for step-and-scan imaging of a mask pattern, present in a mask, on a number of areas of a substrate, which apparatus comprises an illumination unit with a source for EUV radiation, a mask holder for accommodating a mask, a substrate holder for accommodating a substrate, and a projection system. This apparatus is characterized in that the projection system is a mirror projection system as described above.

DESCRIPTION OF THE PREFERRED EMBODIMENTS

Figure 2:
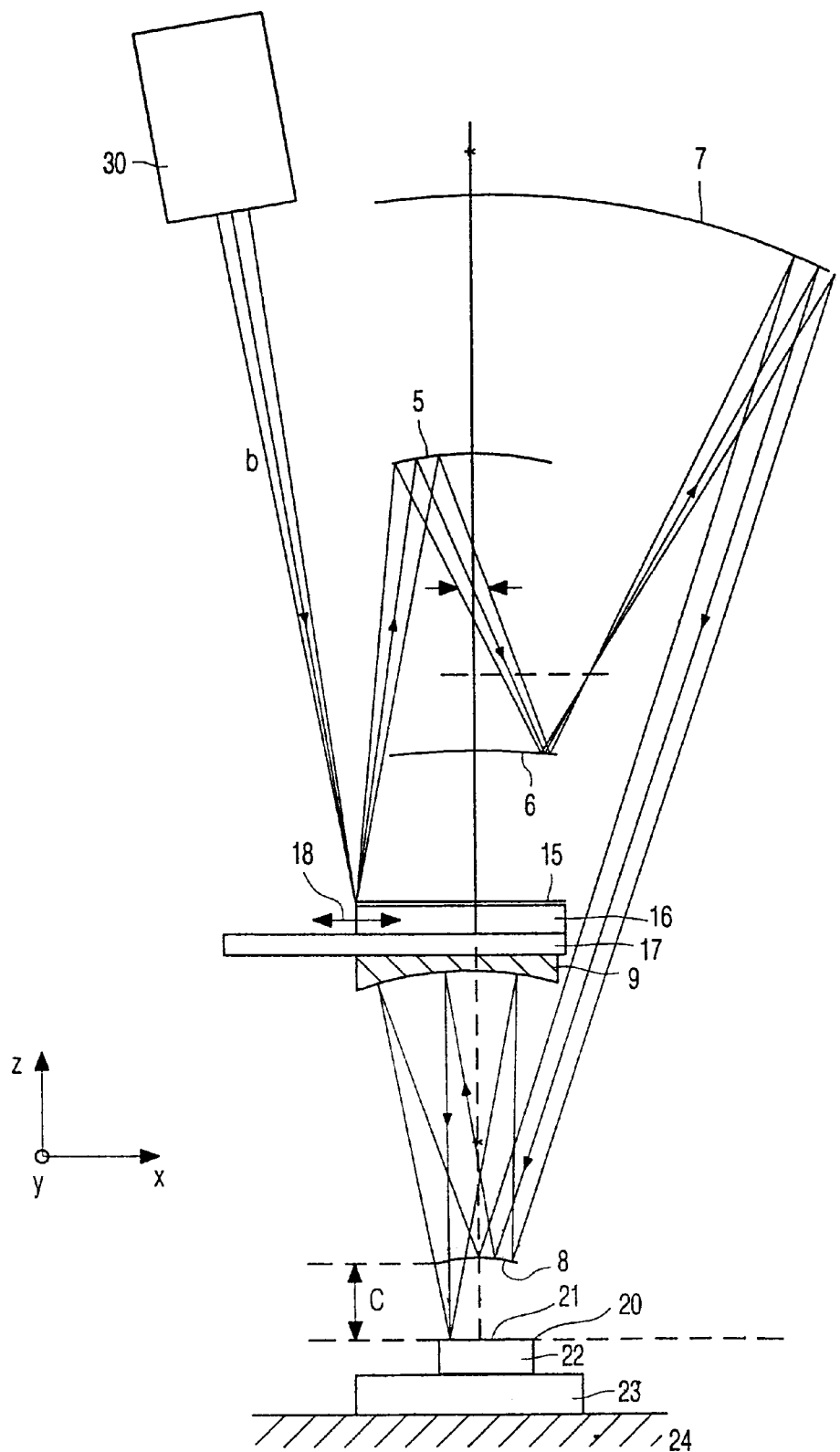
Figure 3:
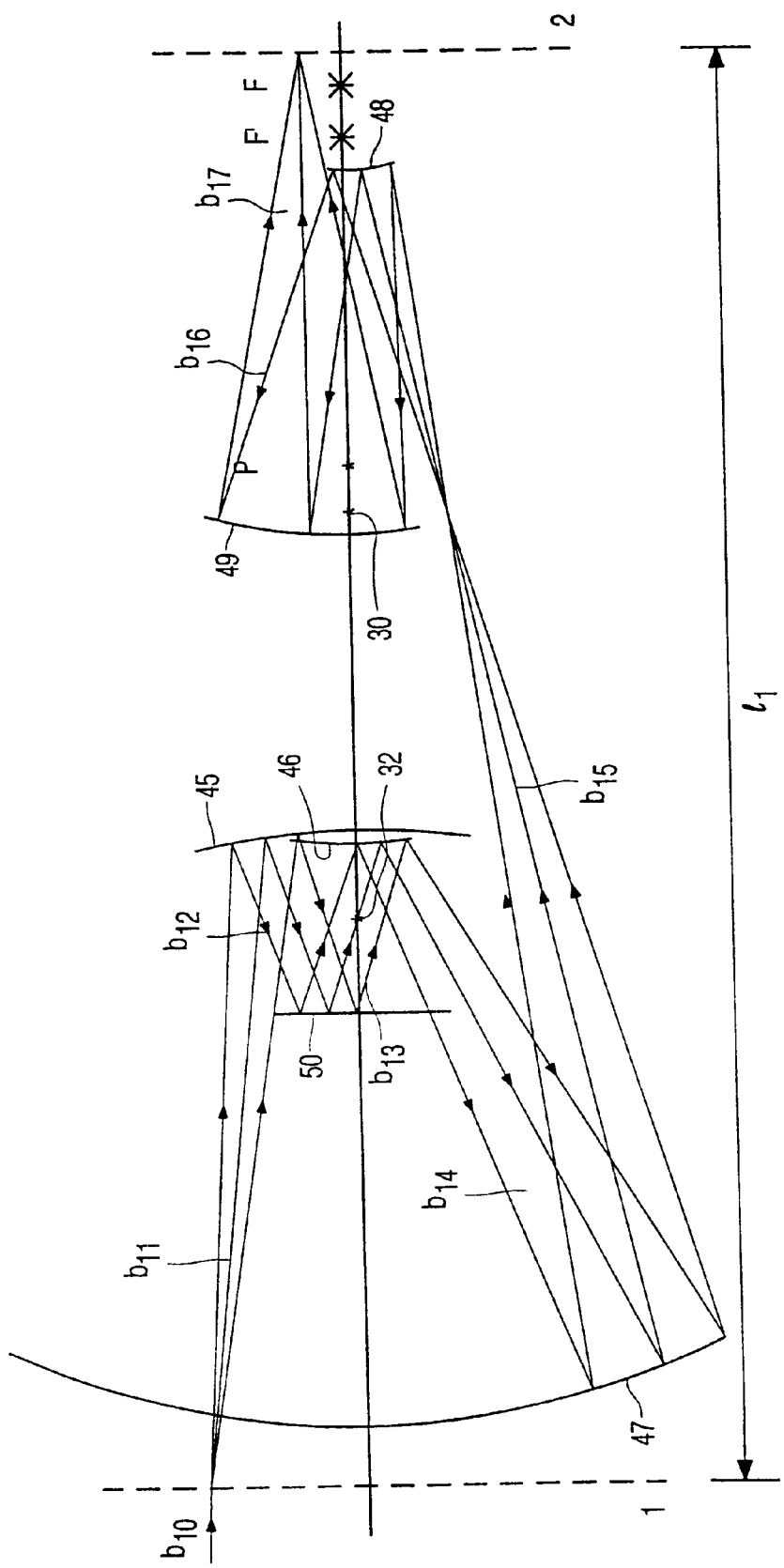
Figure 4:
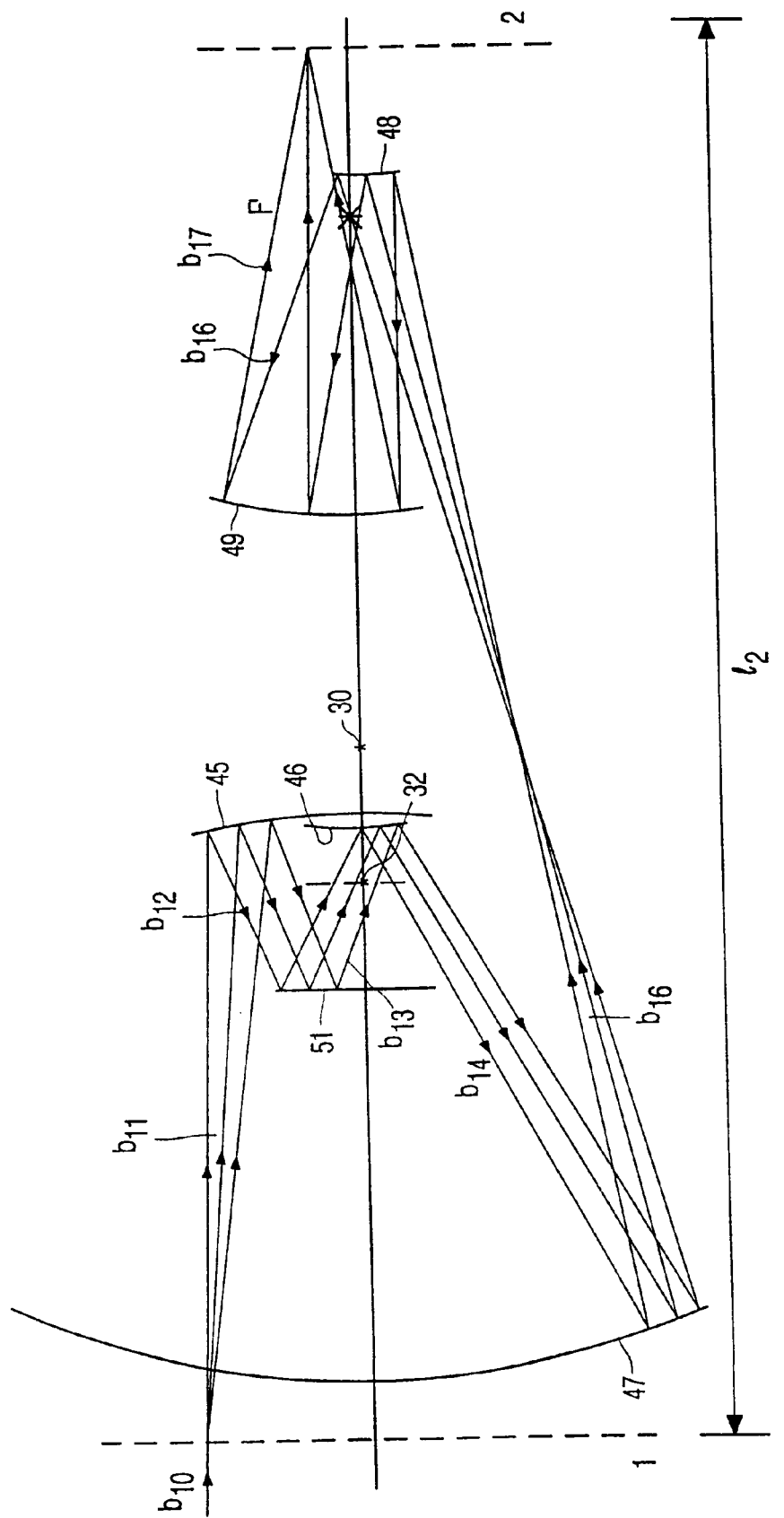

FIG. 1 shows a first embodiment of the projection system according to the invention, FIG. 2 shows diagrammatically an embodiment of a lithographic apparatus comprising such a projection system, and FIGS. 3 and 4 show a second and a third embodiment of the projection system.

In FIG. 1, the mask to be imaged can be arranged, in object plane 1, and the substrate can be arranged in the image plane 2. The image plane is illuminated with a beam b emitted by a, radiation source (not shown) whose chief ray h is inclined towards the optical axis OO'. In the presence of a reflecting mask 15 in the object plane, the beam is reflected as beam $b_1$, to the first mirror 5 of the system, which mirror is concave. This mirror reflects the beam as a converging beam $b_2$ to the second mirror 6 which is convex. The mirror 6 reflects the beam as beam $b_3$ to the third mirror 7. An intermediate image is formed at the position 10 between the mirrors 6 and 7. Mirror 7 is a concave mirror and reflects the beam as a substantially parallel beam $b_4$ to the fourth mirror 8. This mirror is convex and reflects the beam as a diverging beam $b_5$ to the fifth mirror 9 which is convex, and focuses the beam as beam $b_6$ in the image plane 2. The mirrors 5, 6 and 7 jointly constitute a collimator section of the system, and the mirrors 8 and 9 constitute an objective section which forms the desired telecentric image on the substrate.

A diaphragm 14 is arranged between the mirrors 5 and 6 and at the axial position 12. This is possible because the system has been designed in such a way that the beams $b_1$, and $b_2$ are sufficiently separated spatially at the position 12. As is known, such a diaphragm in an imaging system prevents scattered radiation or radiation caused by unwanted reflections from reaching the image-forming beam, whereby the contrast of the image formed in the plane 2 could be decreased.

Furthermore, all mirror surfaces of the system are preferably aspherical. An aspherical surface is understood to mean a surface whose fundamental shape is spherical but whose actual surface locally deviates from this fundamental shape so as to correct spherical aberrations of the system. The fundamental shape of an aspherical surface does not have to be spherical but may be alternatively plane. Also a mirror which, in principle, is plane may have a correcting aspherical surface.

The system is coaxial, which means that the centers of curvatures of all mirrors are located on one axis, the optical axis. From a point of view of assembly and tolerances, this is very advantageous.

The following Table I shows the values of the relevant parameters of the embodiment of FIG. 1. These parameters are:

the distances measured along the optical axis OO':
$d_1$: between the object plane 1 and the first mirror 5;
$d_2$: between the mirror 5 and the first mirror 6;
$d_3$: between the mirror 6 and the first mirror 7;
$d_4$: between the mirror 7 and the first mirror 8;
$d_5$: between the mirror 8 and the first mirror 9;
$d_6$: between the mirror 9 and the image plane 2, the radii of curvature measured along the optical axis:
$R_1$: of the mirror 5;
$R_2$: of the mirror 6;
$R_3$: of the mirror 7;
$R_4$: of the mirror 8;
$R_5$: of the mirror 9, the even terms $a_2$, $a_4$, $a_6$, $a_8$, $a_{10}$ and $a_{12}$ of the known series development:

$$Z = \sum_{i=1}^{6} a_{2i} \cdot r^{2i}$$

describing the variation of an aspherical surface.

TABLE I $d_1$ = 407,0280 mm.
$d_2$ = −266.6040
$d_3$ = 498,1310
$d_4$ = −957,4880
$d_5$ = 259,6670
$d_6$ = −328.1660
$R_1$ = −358,6724 mm.
$R_2$ = −1034,9498
$R_3$ = −753,9869
$R_4$ = −167,5311

TABLE I-continued $R_5$ = −337,4211

| | mirror 5 | mirror 6 | mirror 7 |
|---|---|---|---|
| $a_2$ | −.13940298E − 02 | −.48311518E − 03 | −.66314155E − 03 |
| $a_4$ | .69417630E − 08 | −.11947397E − 07 | −.13676264E − 09 |
| $a_6$ | −.13069723E − 12 | .48162764E − 11 | −.23711675E − 14 |
| $a_8$ | .28564892E − 17 | −.99830434E − 15 | .17707105E − 19 |
| $a_{10}$ | −.10500535E − 21 | .10852556E − 18 | −.80978435E − 25 |
| $a_{12}$ | .40366107E − 26 | −.47475418E − 23 | .14935619E − 30 |

| | mirror 8 | mirror 9 |
|---|---|---|
| $a_2$ | −.29845209E − 02 | −.14818281E − 02 |
| $a_4$ | −.30313077E − 07 | −.34399077E − 08 |
| $a_6$ | −.28313384E − 11 | −.16079104E − 13 |
| $a_5$ | −.11812935E − 15 | −.15057705E − 18 |
| $a_{10}$ | −.17990104E − 20 | .49180832E − 23 |
| $a_{12}$ | .66658543E − 23 | .18985871E − 27 |

The system has a magnification M of +0.25, a numerical aperture NA of 0.20 and the circular segment of the image at the area of the image plane 2 has an inner radius of 24.5 mm, and an outer radius of 26 mm, so that this plane is scanned with a circular segment-shaped spot having a width of 1.5 mm. The length, or cord, of this spot is of the order of 20–25 mm. The total length of the system, 1 in FIG. 1, is approximately 1015 mm. The system is intended for forming an image by means of radiation having a wavelength of 13 nm, and to this end, the mirrors are provided in known manner with a multilayer structure which reflects radiation of this wavelength as satisfactorily as possible. Examples of multilayer structures for this purpose are described in, inter alia, U.S. Pat. No. 5,153,898.

FIG. 2 shows very diagrammatically an embodiment of a step-and-scan lithographic apparatus which comprises a mirror system according to the invention for imaging a mask pattern, present in a reflective mask 15, on a substrate 20 which is provided with a layer 21 sensitive to EUV radiation. The apparatus comprises an illumination unit 30 which is shown diagrammatically, accommodating an EUV radiation source and an optical system for forming an illumination beam b whose cross-section has the shape of a circular segment. The mask 15 to be imaged is arranged on a mask holder 16 which forms part of a mask table 17, with which the mask can be moved in the scanning direction 18, and possibly in a direction perpendicular to the scanning direction, such that all areas of the mask pattern can be positioned under the illumination spot formed by the illumination beam b. The substrate 20 is arranged on a substrate holder 22 which is supported by a substrate table (stage) 23. This table can move the substrate in the scanning direction (X direction) but also in the Y direction perpendicular thereto. The table is supported by the support 24.

Moreover, the substrate can be moved in the Z direction, the direction of the optical axis OO', and rotated about the Z axis. In sophisticated apparatuses, the substrate can also be tilted about the X axis and the Y axis. For further details of a step-and-scan apparatus, reference is made by way of example to PCT patent application WO 97/33204.

Since the mask used in combination with the projection system of FIG. 1 is a reflective mask, this mask can be fully supported. Consequently, under the influence of gravitation, this mask can remain flat on its support, which was already also the case for the substrate. This is of great importance in EUV lithographic projection apparatuses.

The projection system is telecentric on the side of the substrate, which has the advantage that no magnification errors occur upon possible unwanted movements in the Z direction of the substrate with respect to the system.

As is shown in FIGS. 1 and 2, there is sufficient space between the second mirror 6 and the fifth mirror 9 to arrange the mask table, and the mask holder with the mask can be moved in that space so as to realize the desired scanning movement. Consequently, the apparatus can be given a compact design.

Moreover, the free working distance c between the fourth lens 8 and the plane of the substrate, or image plane, is sufficiently large to arrange optical sensors in the space in between. Such sensors, which are already used in stepping apparatuses or step-and-scan apparatuses in which a lens system is used as a projection system, are, for example a height and level sensor described in, for example U.S. Pat. No. 5,191,200, and an image sensor described in, for example, U.S. Pat. No. 5,144,363.

The projection system shown in FIG. 3 may be used in an embodiment of the lithographic projection apparatus other than that shown in FIG. 2, in which embodiment the mask and the substrate are situated at different sides of the mirror projection system and the mask is transparent. This system also comprises five imaging mirrors 45, 46, 47, 48 and 49 which are consecutively concave, convex, concave, convex and concave, similarly as the mirrors 5, 6, 7, 8 and 9 in FIG. 1. The object plane 1 is situated on the left of the projection system and the image plane is situated on its right. In the projection apparatus, in which this projection system is used, the radiation source supplying the illumination beam $b_{10}$ is situated on the left of the object plane 1, and the mask arranged in this plane is a transparent mask.

The beam $b_{11}$ from the mask is incident on the first imaging mirror 45. Arranged in the path of the beam $b_{12}$ reflected by this mirror is a plane mirror 50 which reflects the imaging beam, as beam $b_{13}$, to the second imaging mirror 46 which is situated proximate to the first imaging mirror 45. The imaging beam is subsequently reflected to the image plane 2, consecutively as beam $b_{14}$, by the convex mirror 46, as beam $b_{15}$ by the concave mirror 47, as beam $b_{16}$ by the convex mirror 48 and as beam $b_{17}$ by the concave mirror 49. Now, an intermediate image is formed at the position 30 proximate to the mirror 49. A diaphragm can now be arranged between the plane mirror 50 and the convex mirror 46 at the axial position 32 where the beams $b_{12}$ and $b_{13}$ are just sufficiently separated. This projection system is also a coaxial system, and all imaging mirrors preferably have aspherical surfaces.

Table II states the values of the relevant parameters of the projection system shown in FIG. 3. These parameters are:

the distances measured along the optical axis OO':
  $d_{11}$: between the object plane 1 and the mirror 45;
  $d_{12}$: between the mirror 45 and the mirror 50;
  $d_{13}$: between the mirror 50 and the mirror 46;
  $d_{14}$: between the mirror 46 and the mirror 47;
  $d_{15}$: between the mirror 47 and the mirror 48;
  $d_{16}$: between the mirror 48 and the mirror 49, and
  $d_{17}$: between the mirror 49 and the image plane 2;

the radii of curvature measured along the optical axis:
  $R_{45}$: of the mirror 45;
  $R_{46}$: of the mirror 46;
  $R_{47}$: of the mirror 47;
  $R_{48}$: of the mirror 48;
  $R_{49}$: of the mirror 49,
  $R_{50}$: of the mirror 50, and the even aspherical terms $a_2$, $a_4$, $a_6$, $a_8$, and $a_{10}$.

TABLE II $d_{11}$ = 480.0000 mm.
$d_{12}$ = −127.0150
$d_{13}$ = 118.1150
$d_{14}$ = −406.7396
$d_{15}$ = 878.0910
$d_{16}$ = −253.0640
$d_{17}$ = 329.1190
$R_{45}$ = −548.8380 mm.
$R_{46}$ = 265.3601
$R_{47}$ = 604.7415
$R_{48}$ = 435.3368
$R_{49}$ = 353.7575
$R_{50}$ = ∞

|  | mirror 45 | mirror 46 | mirror 47 |
|---|---|---|---|
| $a_2$ | −.85493758E − 03 | −.18842320E − 02 | .82677996E − 03 |
| $a_4$ | −.77854867E − 09 | −.53734081E − 09 | .55026455E − 09 |
| $a_6$ | .13776269E − 15 | .77436681E − 12 | .72595581E − 15 |
| $a_8$ | −.12932293E − 18 | −.83937188E − 17 | .14921406E − 20 |
| $a_{10}$ | .72450584E − 23 | −.32498962E − 19 | .21485301E − 26 |

|  | mirror 48 | mirror 49 |
|---|---|---|
| $a_2$ | .11485359E − 02 | .14133976E − 02 |
| $a_4$ | .23885607E − 07 | .31344991E − 08 |
| $a_6$ | .40913648E − 12 | .14505232E − 13 |
| $a_8$ | −.82075572E − 17 | .80206576E − 19 |
| $a_{10}$ | .40082766E − 20 | .48066908E − 24 |

This system also has a magnification M of +0.25 and a numerical aperture NA of 0.20 at the image side. However, the circular segment-shaped image field now has an inner radius of 28 mm and an outer radius of 29 mm, hence a width of 1 mm. The distance between the object plane 1 and the image plane 2, 1 in FIG. 3, is approximately 1020 mm.

In the projection system shown in FIG. 3, also the plane mirror may be provided with an aspherical surface. Consequently, correction is possible over a larger image field. FIG. 4 shows a mirror projection system with an aspherical, plane mirror 51. This system is distinguished from that shown in FIG. 4 in that the circular segment-shaped image field has an inner radius of 27.5 mm and an outer radius of 29 mm. Table III shows the values of the parameters of this projection system, using the same notation as for the projection system shown in FIG. 3.

TABLE III $d_{11}$ = 480.0000 mm.
$d_{12}$ = −130.0000
$d_{13}$ = 120.0000
$d_{14}$ = −410.0000
$d_{15}$ = 882.9590
$d_{16}$ = −248.8860
$d_{17}$ = 329.1190
$R_{45}$ = −503.9751 mm.
$R_{46}$ = 305.4602
$R_{47}$ = 598.5052
$R_{48}$ = 296.8178
$R_{49}$ = 349.0694
$R_{50}$ = 4480.6685

|  | mirror 45 | mirror 46 | mirror 47 |
|---|---|---|---|
| $a_2$ | −.99211251E − 03 | −.16368743E − 02 | .83541463E − 03 |
| $a_4$ | .19622061E − 08 | −.12854646E − 06 | .48507724E − 09 |
| $a_6$ | .22372975E − 13 | .30912426E − 10 | .15329580E − 14 |
| $a_8$ | .19165010E − 18 | −.10396790E − 13 | .14921406E − 20 |

TABLE III-continued

| | | | |
|---|---|---|---|
| $a_{10}$ | .72450584E – 23 | –.32498962E – 19 | –.18684709E – 19 |
| | mirror 48 | mirror 49 | mirror 51 |
| $a_2$ | .16845352E – 02 | .14323799E – 02 | .11159048E – 03 |
| $a_4$ | .23195186E – 07 | .30343413E – 08 | .22374106E – 07 |
| $a_6$ | .78265313E – 12 | .16088246E – 13 | –.68284347E – 12 |
| $a_8$ | .23739151E – 15 | .67375506E – 20 | .62784889E – 16 |
| $a_{10}$ | .31035106E – 19 | .48265639E – 23 | –.55338799E – 20 |

The distance between the object plane 1 and the image plane 2, $l_2$ in FIG. 4, is approximately 1029 mm.

The EUV lithographic projection apparatus may be used in the manufacture of ICs but also, for example, liquid crystalline display panels, integrated or planar optical systems, magnetic heads and guidance and detection patterns for magnetic domain memories.

What is claimed is:

1. A mirror projection system for use in a step-and-scan lithographic projection apparatus for imaging a mask pattern in an object plane onto a substrate in an image plane by means of a beam of EUV radiation, which beam has an annular segment-shaped cross-section, the mirror system comprising five imaging mirrors wherein the system has a numerical aperture NA of 0.20 and a magnification M of 0.25.

2. A mirror projection system for use in a step-and-scan lithographic projection apparatus for imaging a mask pattern in an object plane onto a substrate in an image plane by means of a beam of EUV radiation, which beam has an annular segment-shaped cross-section, the mirror system comprising an imaging mirror system consisting of five imaging mirrors, wherein the system is telecentric at the image plane.

3. A mirror projection system as claimed in claim 2, wherein said five imaging mirrors have aspherical surfaces.

4. A mirror projection system as claimed in claim 2 further comprising a space for a reflective mask and a mask holder between second and fifth imaging mirrors of said five imaging mirrors, the object plane being situated between second and fifth imaging mirrors of said five imaging mirrors.

5. A mirror projection system as in claim 4 wherein a first imaging mirror of said five imaging mirrors is concave, a second imaging mirror of said five imaging mirrors is convex, a third imaging mirror of said five imaging mirrors is concave, a fourth imaging mirror of said five imaging mirrors is convex, and a fifth imaging mirror of said five imaging mirrors is concave, the object plane being geometrically situated between the second imaging mirror and the fifth imaging mirror.

6. A mirror projection system for use in a step-and-scan lithographic projection apparatus for imaging a mask pattern in an object plane onto a substrate in an image plane by means of a beam of EUV radiation, which beam has an annular segment-shaped cross-section, the mirror system comprising five imaging mirrors, further comprising a pupil situated between first and second imaging mirrors of said five imaging mirrors.

7. A mirror projection system for use in a step-and-scan lithographic projection apparatus for imaging a mask pattern in an object plane onto a substrate in an image plane by means of a beam of EUV radiation, which beam has an annular segment-shaped cross-section, the mirror system comprising five imaging mirrors, further comprising a plane mirror arranged between a first and a second of said imaging mirrors, the object plane being situated outside the projection system.

8. A mirror projection system as claimed in claim 7, characterized in that the plane mirror has an aspherical correction surface.

* * * * *